(12) United States Patent
Kwon et al.

(10) Patent No.: US 12,073,878 B2
(45) Date of Patent: Aug. 27, 2024

(54) PROCESSING ELEMENT AND ELECTRONIC DEVICE INCLUDING PROCESSING ELEMENT

(71) Applicant: Samsung Electronics Co., Ltd., Suwon-si (KR)

(72) Inventors: Keewon Kwon, Suwon-si (KR); Sewon Yun, Hwaseong-si (KR); Sangwon Kim, Seoul (KR)

(73) Assignees: Samsung Electronics Co., Ltd., Gyeonggi-do (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 84 days.

(21) Appl. No.: 17/505,956

(22) Filed: Oct. 20, 2021

(65) Prior Publication Data

US 2022/0343973 A1  Oct. 27, 2022

(30) Foreign Application Priority Data

Apr. 21, 2021  (KR) ........................ 10-2021-0052012

(51) Int. Cl.
| | | |
|---|---|---|
| *G11C 16/24* | (2006.01) | |
| *G06N 3/063* | (2023.01) | |
| *G11C 11/54* | (2006.01) | |
| *G11C 16/08* | (2006.01) | |
| *G11C 16/10* | (2006.01) | |

(Continued)

(52) U.S. Cl.
CPC .............. *G11C 11/54* (2013.01); *G06N 3/063* (2013.01); *G11C 16/08* (2013.01); *G11C 16/10* (2013.01); *G11C 16/14* (2013.01); *G11C 16/24* (2013.01); *G11C 16/3459* (2013.01)

(58) Field of Classification Search
None
See application file for complete search history.

(56) References Cited

U.S. PATENT DOCUMENTS

| | | | |
|---|---|---|---|
| 5,721,440 A | 2/1998 | Kowalski | |
| 5,835,409 A | 11/1998 | Lambertson | |
| 10,403,361 B2 * | 9/2019 | Widjaja | ............. H01L 29/7841 |

(Continued)

FOREIGN PATENT DOCUMENTS

| | | |
|---|---|---|
| JP | 2004-281841 A | 10/2004 |
| KR | 10-2020-0060739 A | 6/2020 |

*Primary Examiner* — Alfredo Bermudez Lozada
(74) *Attorney, Agent, or Firm* — Harness, Dickey & Pierce, P.L.C.

(57) ABSTRACT

Disclosed is an electronic device which includes processing elements arranged in rows and columns, word lines connected with the rows of the processing elements, bit lines connected with the columns of the processing elements, body lines connected with the columns of the processing elements, and source lines connected with the rows of the processing elements. Each of the processing elements includes a first terminal connected with a corresponding bit line of the bit lines, a second terminal connected with a corresponding source line of the source lines, a control gate connected with a corresponding word line of the word lines, a floating gate between the control gate and a body, a body terminal connected with a corresponding body line of the body lines, and a capacitive element between the floating gate and the corresponding bit line.

18 Claims, 20 Drawing Sheets

(51) Int. Cl.
   *G11C 16/14*     (2006.01)
   *G11C 16/34*     (2006.01)

(56) References Cited

U.S. PATENT DOCUMENTS

| | | | |
|---|---|---|---|
| 10,748,630 | B2 | 8/2020 | Tran et al. |
| 2004/0151031 | A1* | 8/2004 | Tanaka ................ G11C 16/349 |
| | | | 365/185.29 |
| 2005/0199937 | A1* | 9/2005 | Chang ............... H01L 29/40114 |
| | | | 257/314 |
| 2008/0275832 | A1 | 11/2008 | McDaid et al. |
| 2017/0337466 | A1 | 11/2017 | Bayat et al. |
| 2017/0364790 | A1 | 12/2017 | Leobandung |
| 2019/0370639 | A1 | 12/2019 | Yu |
| 2020/0364548 | A1 | 11/2020 | Chang et al. |
| 2020/0372330 | A1 | 11/2020 | Chang et al. |
| 2021/0287746 | A1* | 9/2021 | Chen ................. G11C 16/0433 |

\* cited by examiner

PROCESSING ELEMENT AND ELECTRONIC DEVICE INCLUDING PROCESSING ELEMENT

CROSS-REFERENCE TO RELATED APPLICATIONS

This application claims priority under 35 U.S.C. § 119 to Korean Patent Application No. 10-2021-0052012 filed on Apr. 21, 2021, in the Korean Intellectual Property Office, the disclosures of which are incorporated by reference herein in their entireties.

BACKGROUND

Example embodiments of the present disclosure described herein relate to a processing element based on a flash memory cell; and an electronic device including the processing element.

As machine learning is being researched, a way to implement the machine learning in actual devices is also being researched. Machine learning often requires a large number of iterative parallel computations. Therefore, it is often not efficient to perform the machine learning and/or a machine learning-based inference in a conventional processor.

Therefore, to efficiently perform the machine learning and/or the machine learning-based inference, new types of processors specialized for performing the machine learning and/or the machine learning-based reasoning are being researched. A new type of processor configured to perform the machine learning and/or the machine learning-based reasoning may be called a neural processor or a neuromorphic processor.

SUMMARY

Example embodiments of the present disclosure provide a processing element implemented based on a flash memory cell and an electronic device including the processing element.

According to an embodiment, an electronic device includes a plurality of processing elements that are arranged in rows and columns, a plurality of word lines that are connected with the rows of the plurality of processing elements, a plurality of bit lines that are connected with the columns of the plurality of processing elements, a plurality of body lines that are connected with the columns of the plurality of processing elements, and a plurality of source lines that are connected with the rows of the plurality of processing elements. Each of the plurality of processing elements includes a body including a first terminal connected with a corresponding bit line of the plurality of bit lines, a second terminal connected with a corresponding source line of the plurality of source lines, and a body terminal connected with a corresponding body line of the plurality of body lines, a control gate between the first terminal and the second terminal, and connected with a corresponding word line of the plurality of word lines, a charge storage element between the control gate and the body, and a capacitive element between the charge storage element and the corresponding bit line.

According to an embodiment, an electronic device includes a plurality of processing elements that are arranged in rows and columns, a plurality of word lines that are connected with the rows of the plurality of processing elements, a plurality of bit lines that are connected with the columns of the plurality of processing elements, and a plurality of source lines that are connected with the rows of the plurality of processing elements. Each of the processing elements includes a body including a first terminal connected with a corresponding bit line of the plurality of bit lines and a second terminal connected with a corresponding source line of the plurality of source lines, a control gate between the first terminal and the second terminal, and connected with a corresponding word line of the plurality of word lines, a charge storage element between the control gate and the body, and a capacitive element between the charge storage element and the corresponding bit line.

According to an embodiment, a processing element includes a body including a first terminal connected with a bit line, a second terminal connected with a source line, and a body terminal connected with a conductive line; a control gate connected with a word line; a charge storage element between the control gate and the body; and a capacitive element between the charge storage element and the bit line.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
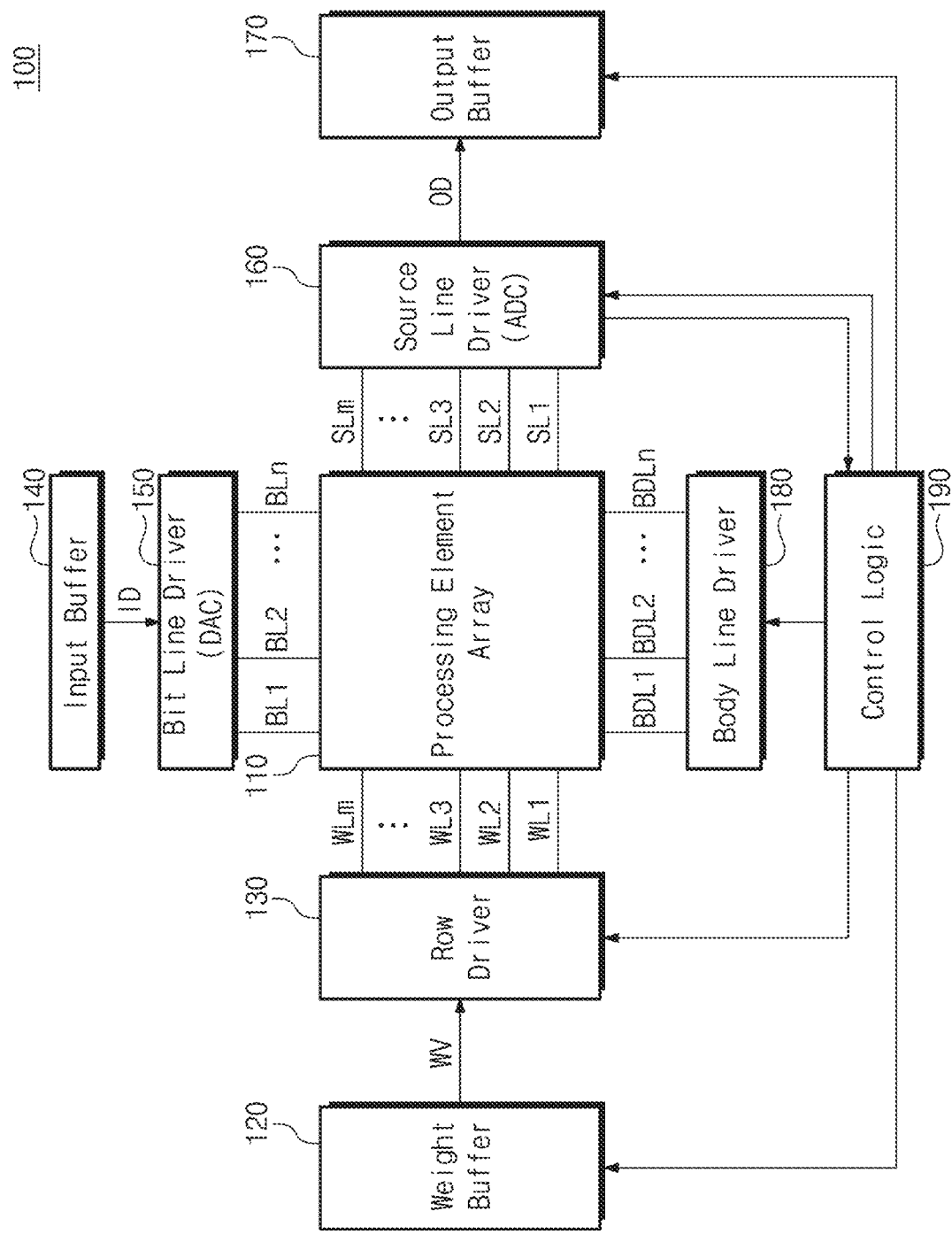
FIG. 1 illustrates an electronic device according to some example embodiments of the present disclosure.

Below, example embodiments of the present disclosure may be described in detail and clearly to such an extent that an ordinary one in the art may easily implement the present disclosure. For example, example embodiments may be embodied in various different forms, and should not be construed as being limited to only the illustrated embodiments. Unless otherwise noted, like reference characters denote like elements throughout the attached drawings and written description, and thus descriptions will not be repeated.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

FIG. 1 illustrates an electronic device 100 according to some example embodiments of the present disclosure. The electronic device 100 may include a neural processor and/or a neuromorphic processor. Referring to FIG. 1, the electronic device 100 may include a processing element array 110, a weight buffer 120, a row driver 130, an input buffer 140, a bit line driver 150, a source line driver 160, an output buffer 170, a body line driver 180, and control logic 190.

The processing element array 110 may include a plurality of processing elements. The processing elements may be arranged in rows and columns. Rows of the processing elements may be respectively connected with first to m-th word lines WL1 to WLm and may be respectively connected with first to m-th source lines SL1 to SLm. Columns of the processing elements may be respectively connected with first to n-th bit lines BL1 to BLn and may be respectively connected with first to n-th body lines BDL1 to BDLn.

Each of the processing elements may store a weight value. Each of the processing elements may compute and/or output computation results based on input data and/or a weight value. For example, weight values may be stored in the processing elements based on voltages of the first to m-th word lines WL1 to WLm. Input data may be transferred to the processing elements through the first to n-th bit lines BL1 to BLn. Computation results of the processing elements may be output through the first to m-th source lines SL1 to SLm.

An operation of storing a weight value(s) in a processing element(s) may be called a program operation. An operation of inputting input data to a processing element(s) and receiving output data as a computation result(s) may be called as a read operation. An operation of deleting a weight value(s) stored in a processing element(s) may be called an erase operation.

The weight buffer 120 may operate under control of the control logic 190. The weight buffer 120 may store weight values WV. In the program operation, the weight buffer 120 may provide the weight values WV to the row driver 130.

The row driver 130 may operate under control of the control logic 190. The row driver 130 may be connected with the first to m-th word lines WL1 to WLm. In the program operation, the row driver 130 may receive the weight value WV from the weight buffer 120. The row driver 130 may adjust levels of voltages to be applied to the first to m-th word lines WL1 to WLm based on the weight value WV. In the read operation and/or the erase operation, the row driver 130 may adjust voltages to be applied to the first to m-th word lines WL1 to WLm in compliance with a given rule.

The input buffer 140 may operate under control of the control logic 190. The input buffer 140 may store input data ID. In the read operation, the input buffer 140 may provide the input data ID to the bit line driver 150.

The bit line driver 150 may operate under control of the control logic 190. The bit line driver 150 may be connected with the first to n-th bit lines BL1 to BLn. In the read operation, the bit line driver 150 may receive the input data ID from the input buffer 140.

In the read operation, the bit line driver 150 may adjust levels of voltages to be applied to the first to n-th bit lines BL1 to BLn based on the input data ID. For example, the bit line driver 150 may operate as a digital-to-analog converter (DAC) that changes the input data ID into a voltage. In the program operation and/or the erase operation, the bit line driver 150 may adjust voltages to be applied to the first to n-th bit lines BL1 to BLn in compliance with, e.g., a given rule.

The source line driver 160 may operate under the control of the control logic 190. The source line driver 160 may be connected with the first to m-th source lines SL1 to SLm. In the program operation, the read operation, and/or the erase operation the source line driver 160 may adjust voltages of the first to m-th source lines SL1 to SLm in compliance with, e.g., a given rule. In the read operation, the source line driver 160 may convert the amount of current output through at least one source line among the first to m-th source lines SL1 to SLm into a digital value(s). For example, the source line driver 160 may operate as an analog-to-digital converter (ADC) that converts a current amount into output data OD. The output data OD may be a computation result of the processing element array 110. The source line driver 160 may provide the output data OD to the output buffer 170.

The output buffer 170 may operate under control of the control logic 190. The output buffer 170 may receive the output data OD from the source line driver 160. The output buffer 170 may output the output data OD to an external device and/or may feed the output data OD back to the input buffer 140.

The body line driver 180 may operate under control of the control logic 190. The body line driver 180 may be connected with the first to n-th body lines BDL1 to BDLn. In the program operation, the read operation, and/or the erase operation the body line driver 180 may adjust voltages to be applied to the first to n-th body lines BDL1 to BDLn in compliance with, e.g., a given rule.

The control logic 190 may control the components of the electronic device 100 so as to perform the program operation, the read operation, and/or the erase operation. The control logic 190 may receive the output data OD from the source line driver 160. The control logic 190 may perform a verification operation based on the output data OD. The verification operation may be similar to the read operation.

Alternatively, the control logic 190 may receive a current(s) through the first to m-th source lines SL1 to SLm. The control logic 190 may perform the verification operation, based on the current(s).

In some embodiments, the weight buffer 120, the input buffer 140, and/or the output buffer 170 may include and/or be included in a region of memory and/or may serve as a cache memory. In some embodiments, the weight buffer 120, the input buffer 140, and/or the output buffer 170 may be implemented with buffers that are physically separated from each other. Alternatively, at least two of the weight buffer 120, the input buffer 140, and the output buffer 170 may be implemented with buffers that are logically distinguished within one physical buffer.

Figure 2:
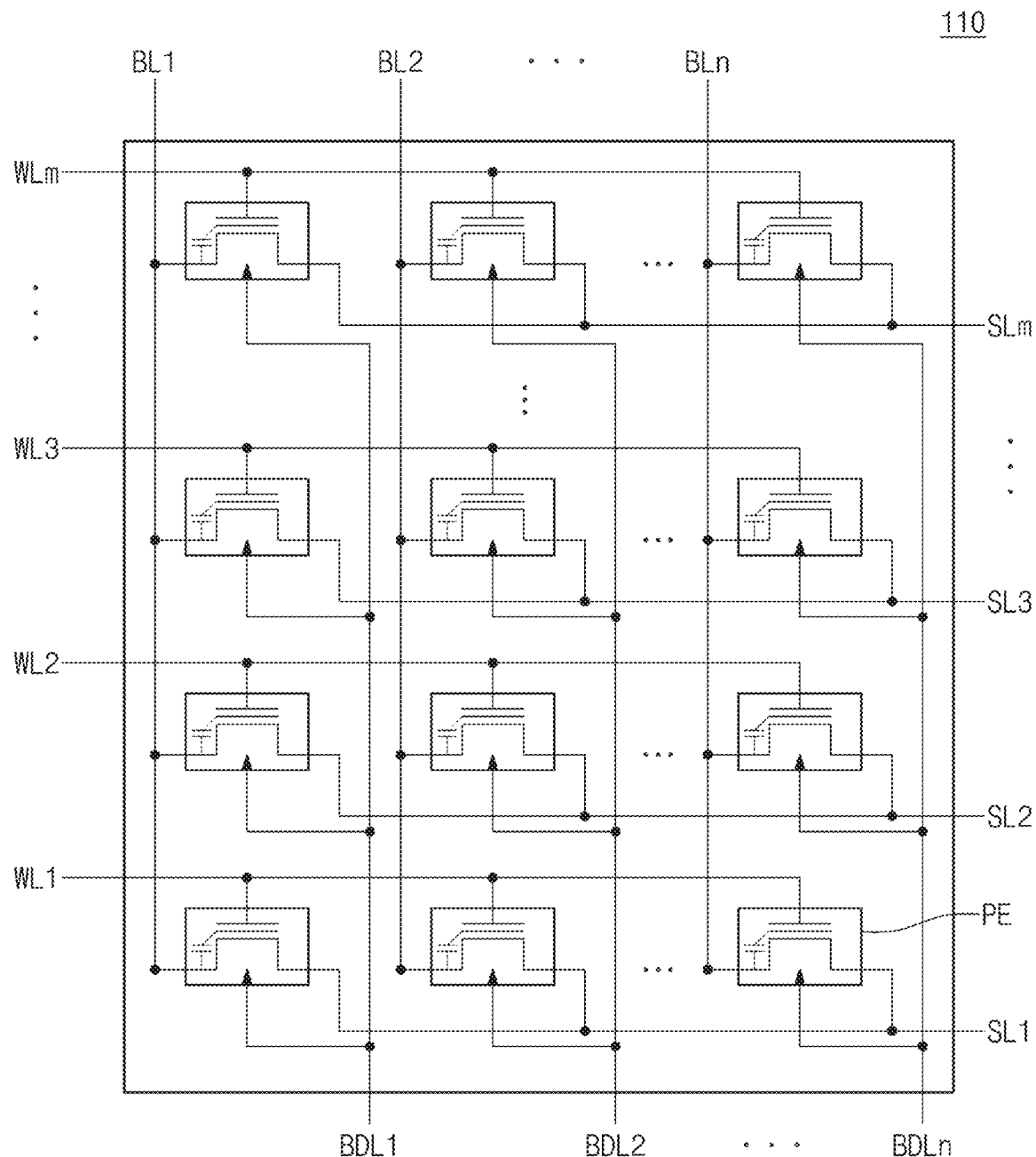
FIG. 2 illustrates a processing element array according to some example embodiments of the present disclosure.

FIG. 2 illustrates the processing element array 110 according to some example embodiments of the present disclosure. Referring to FIGS. 1 and 2, the processing element array 110 may include a plurality of processing elements PE. Each of the processing elements PE may be based on a flash memory cell that includes a first terminal corresponding to a drain (or a source), a second terminal corresponding to a source (or a drain), a charge storage element, and a control gate. Each of the processing elements PE may have a structure in which a capacitive element is added between the charge storage element and a bit line (e.g., a terminal of a bit line side), and a body terminal connected with a body line and used for erasing is included. The charge storage element may include a floating gate and/or a charge trap element. Even though the floating gate is described below, the terms 'floating gate' can be replaced with 'charge trap element'.

The control gate of each of the processing elements PE may be connected with the corresponding word line of the first to m-th word lines WL1 to WLm. The first terminal (e.g., a terminal to which the capacitive element is provided) of each of the processing elements PE may be connected with the corresponding bit line of the first to n-th bit lines BL1 to BLn. The second terminal of each of the processing elements PE may be connected with the corresponding source line of the first to m-th source lines SL1 to SLm. The body terminal of each of the processing elements PE may be connected with the corresponding body line of the first to n-th body lines BDL1 to BDLn.

Figure 3:
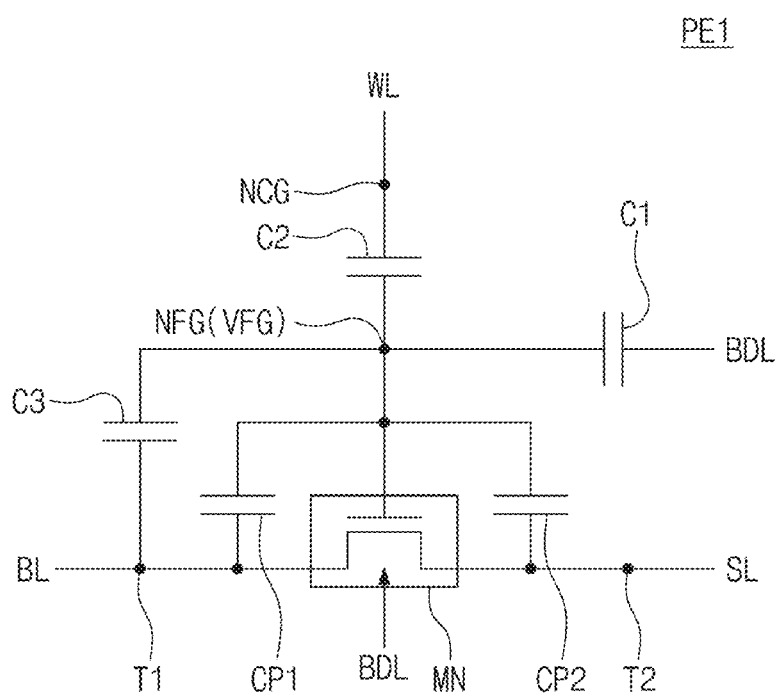
FIG. 3 illustrates a processing element according to a first example.

FIG. 3 illustrates a processing element PE1 according to a first example. The processing element PE1, according to the first example, may be a modeled circuit diagram of each of the processing elements PE. Referring to FIGS. 1, 2, and 3, the processing element PE1 may include a transistor MN.

A first terminal T1 of the transistor MN may be connected with the corresponding bit line BL. A second terminal T2 of the transistor MN may be connected with the corresponding source line SL. A gate of the transistor MN may correspond to the floating gate of the processing element PE1. In some example embodiments, the floating gate may be marked by a floating gate node NFG. A voltage of the floating gate node NFG may be referred to as a floating gate voltage VFG.

A first parasitic capacitor CP1 may correspond to a parasitic capacitor between the floating gate and the first terminal T1. A second parasitic capacitor CP2 may correspond to a parasitic capacitor between the floating gate and the second terminal T2. A first capacitor C1 may be a capacitor between the floating gate of the processing element PE1 and a body line BDL.

The control gate of the processing element PE1 may be marked by a control gate node NCG. A second capacitor C2 may be between the floating gate of the processing element PE1 and the control gate. A third capacitor C3 may be a capacitor between the floating gate of the processing element PE1 and the first terminal T1.

Figure 4:
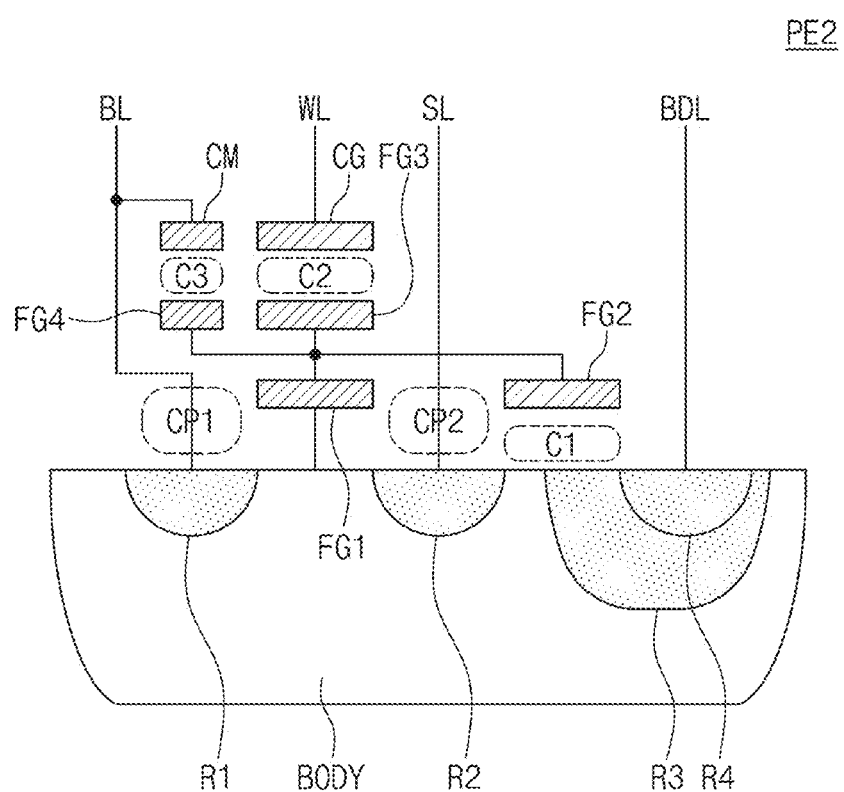
FIG. 4 illustrates a processing element according to a second example.

FIG. 4 illustrates a processing element PE2 according to a second example. The processing element PE2 according to the second example may be a cross-sectional view of each of the processing elements PE. Referring to FIGS. 1, 2, 3, and 4, the processing element PE2 may be implemented at and/or in a body "BODY." In some embodiments, the body "BODY" may be a substrate, a P-well, and/or a pocket P-well.

A first region R1 may be formed in the body "BODY". The first region R1 may be an N-type region, or a combination of an N-type region and a P-type region. The first region R1 may correspond to the first terminal T1. The bit line BL may be connected with the first region R1. A second region R2 may be formed in the body "BODY". The second region R2 may be an N-type region, or a combination of an N-type region and a P-type region. The second region R2 may correspond to the second terminal T2. The source line SL may be connected with the second region R2.

A third region R3 may be formed in the body "BODY". The third region R3 may be an N-type region. A fourth region R4 may be formed in the third region R3. The fourth region R4 may be an N-type region, or a combination of an N-type region and a P-type region. For example, the fourth region R4 may include a different type of and/or have a different concentration of dopant(s) compared to the third region R3. The fourth region R4 may be connected to a body terminal. The body line BDL may be connected with the fourth region R4. The first region R1, the second region R2, and the third region R3 may be separated from each other within the body "BODY".

A first floating gate FG1 may be disposed on the body "BODY" between the first region R1 and the second region R2. The first floating gate FG1 may be electrically separated from the body "BODY." For example, a gap and/or an insulator (not illustrated) may separate the first floating gate FG1 from the body "BODY." The first floating gate FG1 may correspond to the gate of the transistor MN. The first floating gate FG1, the first region R1, and the second region R2 may constitute the transistor MN.

The first parasitic capacitor CP1 may be formed between the first floating gate FG1 and the first region R1. The second parasitic capacitor CP2 may be formed between the first floating gate FG1 and the second region R2.

A second floating gate FG2 may be disposed on the third region R3. The second floating gate FG2 may be electrically separated from the body "BODY", the third region R3, and the fourth region R4. For example, a gap and/or an insulator (not illustrated) may separate the second floating gate FG1 from the body "BODY" and/or the third region R3. The electrically separated second floating gate FG2 and third region R3 may form the first capacitor C1.

A third floating gate FG3 may form the second capacitor C2 together with a control gate CG. A fourth floating gate FG4 may form the third capacitor C3 together with a conductive material CM connected with the bit line BL. For example, the second capacitor C2 and/or the third capacitor C3 may be implemented with a metal-insulator-metal (MIM) capacitor and/or a metal-oxide-silicon (MOS) capacitor.

The first floating gate FG1, the second floating gate FG2, the third floating gate FG3, and/or the fourth floating gate FG4 may be electrically connected with each other. The first floating gate FG1, the second floating gate FG2, the third floating gate FG3, and the fourth floating gate FG4 may respectively correspond to a first portion, a second portion, a third portion, and a fourth portion of the floating gate of the processing element PE1.

In some example embodiments, the third region R3 may be extended, e.g., in a column direction and may be shared by processing elements PE belonging to each row from among the processing elements PE.

Figure 5:
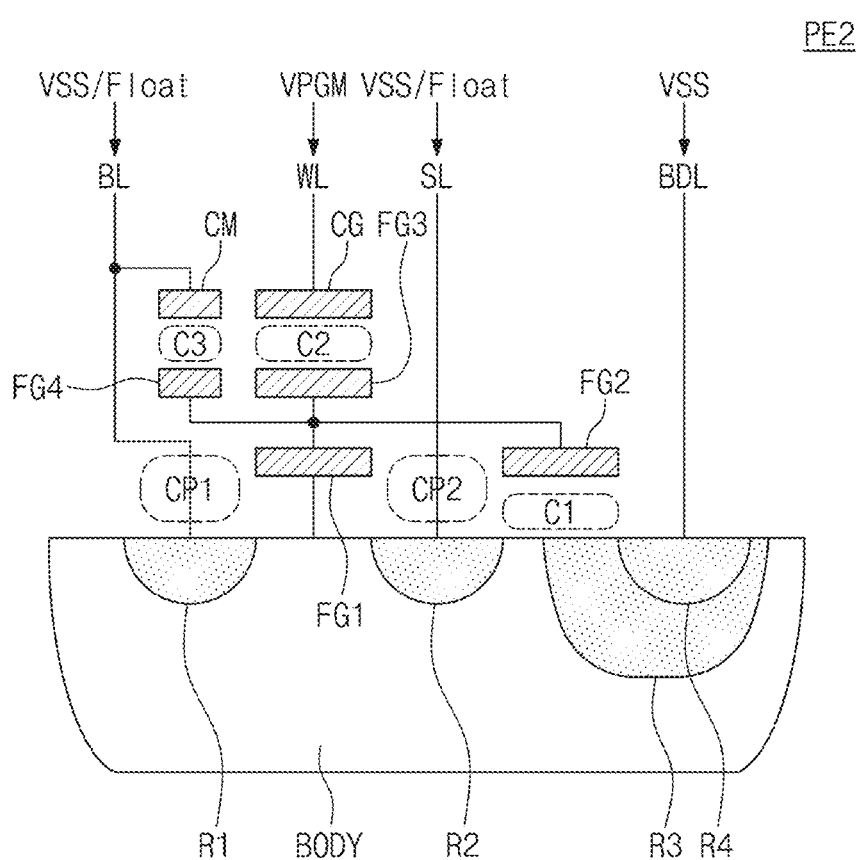
FIG. 5 illustrates an example in which voltages are applied to the processing element of FIG. 4 in a program operation.

FIG. 5 illustrates an example in which voltages are applied to the processing element PE2 in the program operation. Referring to FIGS. 1, 2, 3, and 5, in the program operation, the row driver 130 may apply a first program voltage VPGM1 to the word line WL. The first program voltage VPGM1 may be a high voltage (e.g., greater than a power supply voltage). For example, the power supply voltage may be an operating voltage that is supplied from an external device to the electronic device 100.

In the program operation, the bit line driver 150 may apply a ground voltage VSS to the bit line BL and/or may float the bit line BL. For example, to float the bit line BL, charge carriers (e.g., electrons) may be prohibited to flow to or from the bit line BL. The ground voltage VSS may be a voltage that is supplied from the external device to the electronic device 100. In the program operation, the source line driver 160 may apply the ground voltage VSS to the source line SL and/or may float the source line SL. For example, to float the source line SL, charge carriers (e.g., electrons) may be prohibited to flow to or from the source line SL. In the program operation, the body line driver 180 may apply the ground voltage VSS to the body line BDL.

The first program voltage VPGM1 may be transferred to the second floating gate FG2 by the coupling of the second capacitor C2. Because the ground voltage VSS is supplied to the body line BDL, the tunneling may occur at the first capacitor C1. For example, electrons may be injected into the second floating gate FG2. The electrons injected into the second floating gate FG2 may be shared with the first floating gate FG1. For example, a threshold voltage of the processing element PE2 may increase.

Figure 6:
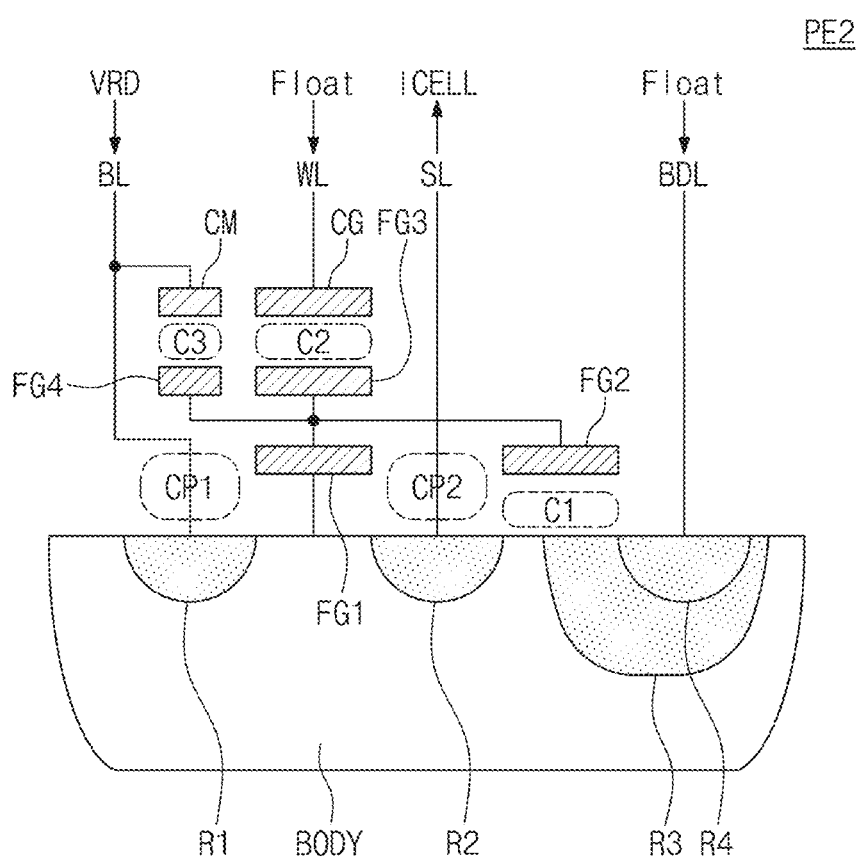
FIG. 6 illustrates an example in which voltages are applied to the processing element of FIG. 4 in a read operation.

FIG. 6 illustrates an example in which voltages are applied to the processing element PE2 in the read operation. Referring to FIGS. 1, 2, 3, and 6, in the read operation, the row driver 130 may float the word line WL. In the read operation, the bit line driver 150 may apply a read voltage VRD to the bit line BL. In the read operation, the body line driver 180 may float the body line BDL.

The read voltage VRD may be transferred to the fourth floating gate FG4 by the coupling of the third capacitor C3. The read voltage VRD transferred to the fourth floating gate FG4 may be transferred to the first floating gate FG1. The read voltage VRD transferred to the first floating gate FG1 may form a channel in a region of the body "BODY" between the first region R1 and the second region R2.

For example, the transistor MN may be turned on by the read voltage VRD, and a current (for example, a cell current ICELL) may flow from the bit line BL to the source line SL by the read voltage VRD. In the read operation, the source line driver 160 may receive the cell current ICELL from the source line SL.

Equation 1 below shows the cell current ICELL modeled when there is no third capacitor C3. In some example embodiments, Equation 1 may be multiplied by any constant number.

$$ICELL = (VFG - VTH) \cdot VBL - \frac{VBL^2}{2} \quad \text{[Equation 1]}$$

In Equation 1, "VFG" indicates an initial voltage of the floating gate of the processing element PE2, and "VTH" indicates a threshold voltage of the processing element PE2. "VBL" indicates a voltage of the bit line BL. As expressed by Equation 1, the cell current ICELL includes a non-linear component. Accordingly, a range of the read voltage VRD of the processing element PE2 (e.g., an operation range of the processing element PE2) may be limited.

Equation 2 below shows the cell current ICELL modeled when the third capacitor C3 is added. In some example embodiments, Equation 2 may be multiplied by any constant number.

$$ICELL = (VFG - VTH) \cdot VBL - \left(\frac{1}{2} - \frac{CP2}{C1 + C2 + CP1 + CP2}\right) \quad \text{[Equation 2]}$$

In Equation 2, the C1, C2, CP1, and CP2 may, respectively, refer to the capacitances of the first capacitor C1, the second capacitor C2, the first parasitic capacitor CP1, and the second parasitic capacitor CP2. In response to a condition of Equation 3 being satisfied, a non-linear component may be removed from the cell current ICELL.

$$\frac{CP2}{C1 + C2 + CP1 + CP2} = \frac{1}{2} \quad \text{[Equation 3]}$$

In response to the non-linear component being removed from the cell current ICELL, the amount of cell current ICELL may be in the form of a linear product of a bit line voltage. For example, the processing element PE2 may operate as a linear multiplier. Because the linearity of the processing element PE2 is improved, an operation range of a value of input data of the processing element PE2 may be expanded.

Figure 7:
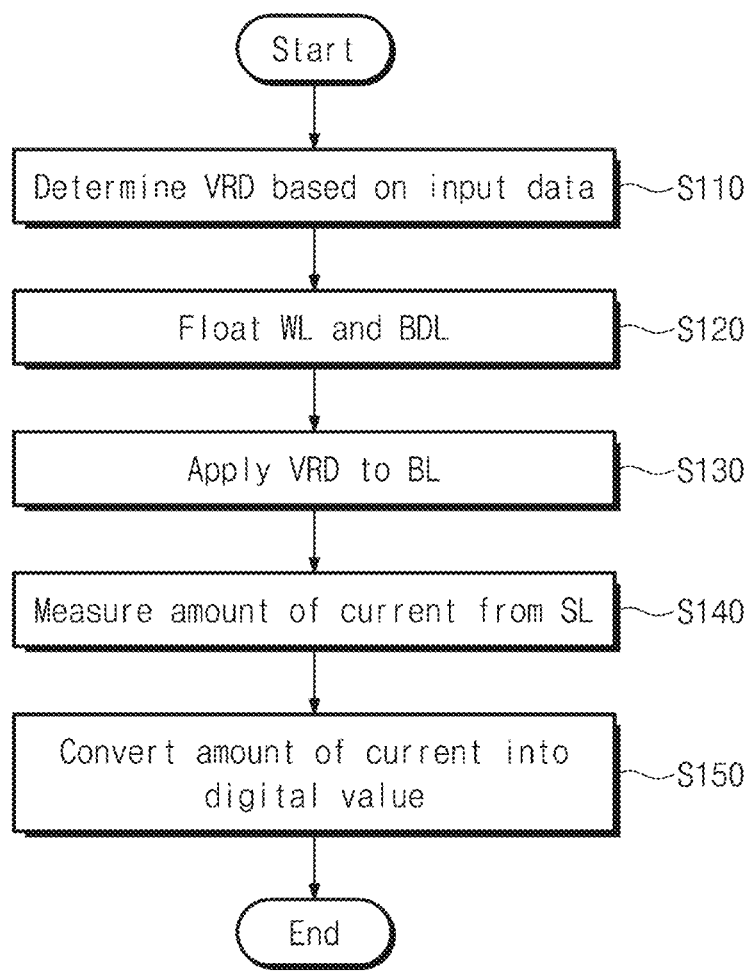
FIG. 7 shows an example in which a read operation is performed in an electronic device.

FIG. 7 shows an example in which a read operation is performed in the electronic device 100. Referring to FIGS. 1, 2, 3, 6, and 7, in operation S110, the bit line driver 150 may determine at least one read voltage VRD based on at least one input data ID. For example, the bit line driver 150 may perform digital-to-analog conversion in which a value of at least one input data is converted into a level of at least one read voltage VRD.

In operation S120, the row driver 130 may float at least one word line selected from the first to m-th word lines WL1 to WLm; and/or the body line driver 180 may float at least one body line selected from the first to n-th body lines BDL1 to BDLn.

In operation S130, the bit line driver 150 may apply the at least one read voltage VRD to at least one bit line selected from the first to n-th bit lines BL1 to BLn.

In operation S140, the source line driver 160 may measure the amount of current from at least one source line (e.g., among the first to m-th source lines SL1 to SLm) corresponding to the at least one selected word line.

In operation S150, the source line driver 160 may convert the amount of current of the at least one source line into at least one digital value. The at least one digital value may be, for example, referred to as at least one output data.

Figure 8:
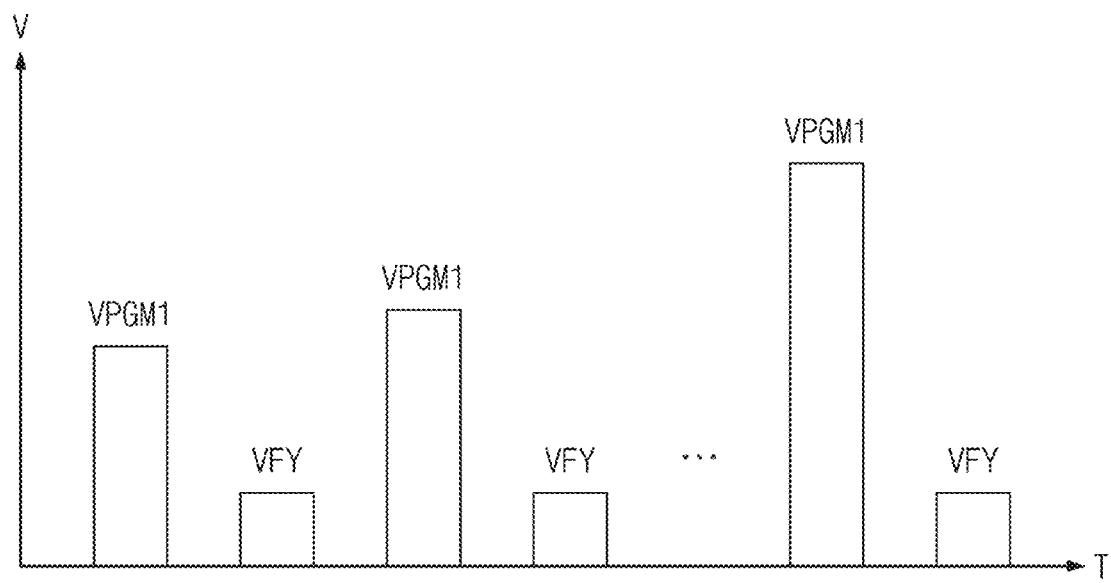
FIG. 8 illustrates an example in which an electronic device performs a program operation and a verification operation alternately and repeatedly.

FIG. 8 illustrates an example in which the electronic device 100 performs the program operation and the verification operation alternately and repeatedly. In FIG. 8, a horizontal axis denotes a time T, and a vertical axis denotes a voltage V applied to the processing element PE2. Referring to FIGS. 1, 2, 3, 5, 6, and 8, as described with reference to FIG. 5, in the program operation, the first program voltage VPGM1 may be applied to the processing element PE2.

A verification operation may be similar to the read operation described with reference to FIG. 6. For example, the verification operation may be performed by applying a verification voltage VFY instead of the read voltage VRD in the read operation of FIG. 6.

In response to a threshold voltage of the processing element PE2 being smaller than the verification voltage VFY, the processing element PE2 may be turned on by the verification voltage VFY. In response to the processing element PE2 being turned on (e.g., when a current output through the corresponding source line is detected by the control logic 190) the row driver 130 may gradually increase a level of the first program voltage VPGM1.

The program operation and the verification operation may be performed repeatedly and alternately while gradually increasing a level of the first program voltage VPGM1. The program operation and the verification operation may be repeatedly performed until the processing element PE2 is turned off by the verification voltage VFY. For example, the program operation and the verification operation may be repeatedly performed until the threshold voltage of the processing element PE2 is greater than the verification voltage VFY.

Figure 9:
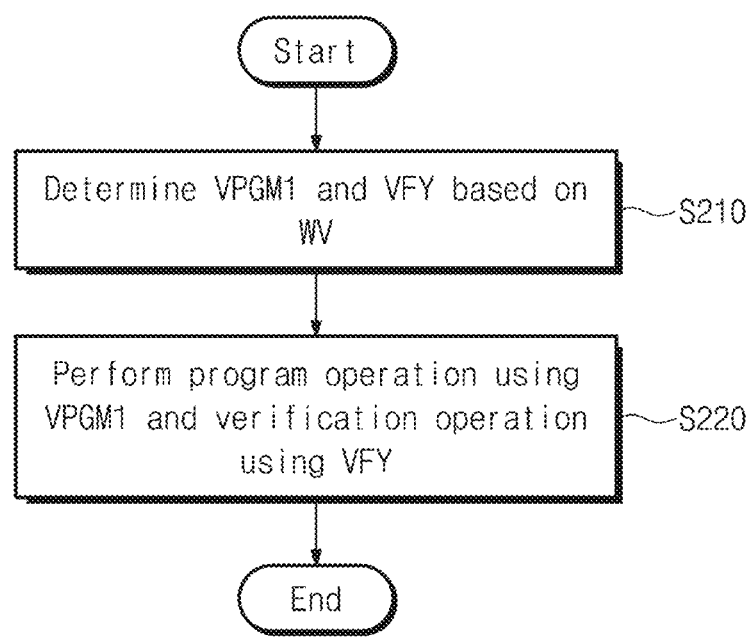
FIG. 9 illustrates an example in which an electronic device performs a program operation and a verification operation.

FIG. 9 illustrates an example in which the electronic device 100 performs the program operation and the verification operation. Referring to FIGS. 1, 2, 3, 6, and 9, in operation S210, the row driver 130 may determine levels for the first program voltage VPGM1 and the verification voltage VFY, based on the weight value WV. In operation S220, the electronic device 100 may perform the program operation by using the first program voltage VPGM1 and/or may perform the verification operation by using the verification voltage VFY.

In some example embodiments, in response to a threshold voltage of the processing element PE2 changing, the amount of cell current ICELL may change even though the same read voltage VRD is applied thereto. For example, a coefficient of computation of the processing element PE2, for example, a weight value may change. The electronic device 100 may adjust a threshold voltage of the processing element PE2 to a target level by adjusting a level of the verification voltage VFY.

In some embodiments, the first program voltage VPGM1 may include a program start voltage and a voltage increment. The program start voltage may be the first program voltage VPGM1 that is first applied to the processing element PE2. The voltage increment may indicate the degree by which the first program voltage VPGM1 increases as the program operation is repeated.

The electronic device 100 may determine the program start voltage based on the weight value WV. For example, the electronic device 100 may first perform the verification operation to detect a current threshold voltage of the processing element PE2. In some embodiments, the verification operation may include two or more verification operations including detecting a level of the verification voltage VFY at which the processing elements PE are turned on and/or a level of the verification voltage VFY at which the processing elements PE are turned off.

The electronic device 100 may determine the program start voltage, based on a difference between the current threshold voltage of the processing element PE2 and the verification voltage VFY generated from the weight value WV.

Figure 10:
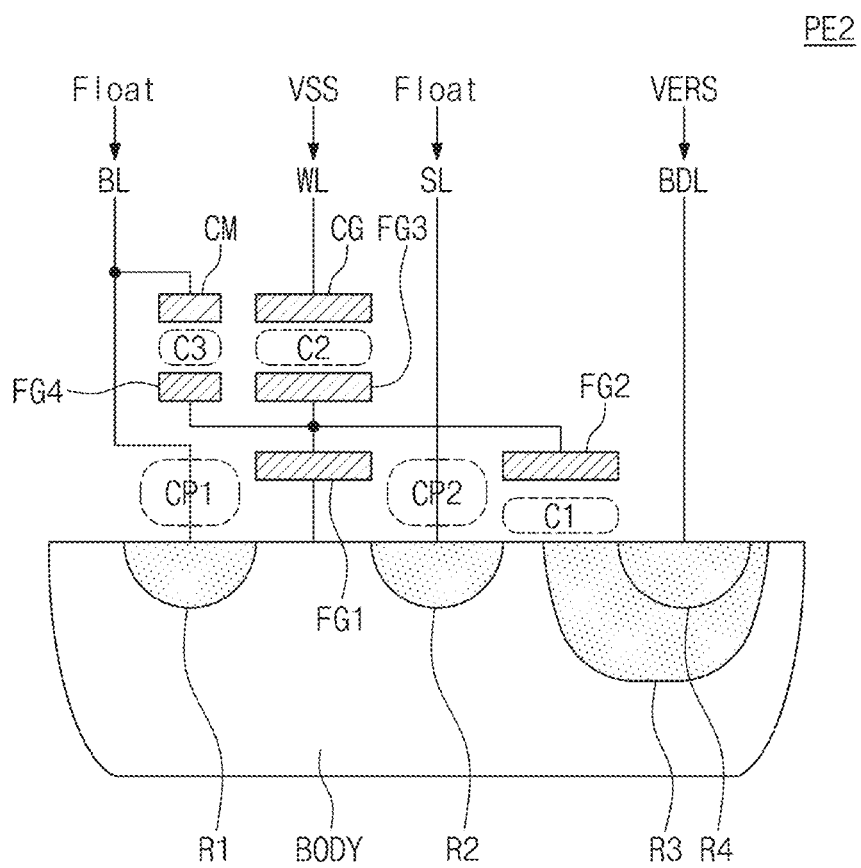
FIG. 10 illustrates an example in which voltages are applied to the processing element of FIG. 4 in an erase operation.

FIG. 10 illustrates an example in which voltages are applied to the processing element PE2 in the erase operation. Referring to FIGS. 1, 2, 3, and 10, in the erase operation, the row driver 130 may apply the ground voltage VSS to the word line WL.

In the erase operation, the bit line driver 150 may float the bit line BL. In the erase operation, the source line driver 160 may float the source line SL. In the erase operation, the body line driver 180 may apply an erase voltage VERS to the body line BDL. The erase voltage VERS may be a high voltage greater than the power supply voltage.

The ground voltage VSS applied to the word line WL and the erase voltage VERS applied to the body line BDL may form an electric field across the first capacitor C1. Accordingly, electrons may be discharged from the second floating gate FG2 to the third region R3. Thereby, the threshold voltage of the processing element PE2 may decrease.

In some embodiments, as described with reference to FIG. 8, the erase operation and the verification operation may be performed repeatedly and alternately. As the erase operation is repeated, the erase voltage VERS may gradually increase.

Figure 11:
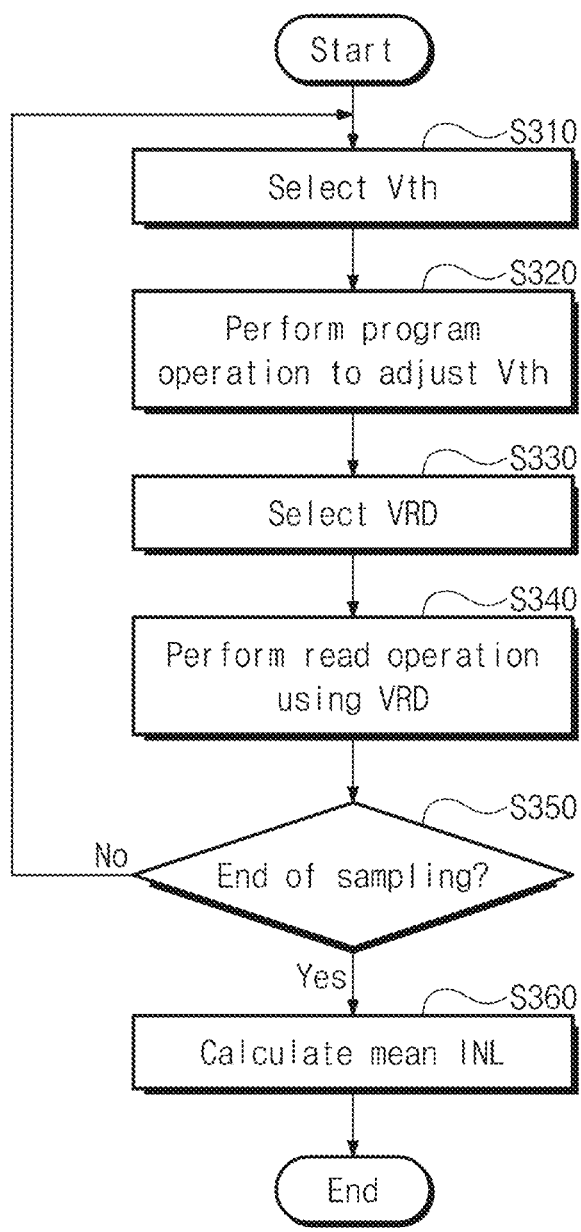
FIG. 11 illustrates an example of a method of measuring integral non-linearity of processing elements according to some example embodiments of the present disclosure.

FIG. 11 illustrates an example of a method of measuring integral non-linearity (INL) of the processing elements PE according to some example embodiments of the present disclosure. Referring to FIGS. 1, 2, and 11, in operation S310, the electronic device 100 may select a threshold voltage Vth (e.g., a target threshold voltage) of the processing elements PE. In operation S320, the electronic device 100 may perform the program operation (and/or program operations and verification operations) to adjust the threshold voltage Vth of the processing elements PE.

In operation S330, the electronic device 100 may select the read voltage VRD. In operation S340, the electronic device 100 may perform the read operation by using the read voltage VRD. The electronic device 100 may measure and record the amount of current output through a source line.

Operation S310 to operation S340 may correspond to sampling for detecting features of the processing elements PE. In operation S350, whether the sampling is completed may be determined, and/or operation S310 to operation S340 may be repeated if the sampling is not complete. For example, the sampling may be performed as much as a given (and/other otherwise determined) number of times. In response to the sampling being completed, operation S360 may be performed.

In operation S360, the electronic device 100 may calculate mean integral non-linearity (INL). For example, the electronic device 100 may generate a trend line, based on the sampled data. The electronic device 100 may calculate a difference between the trend line and the sampled data as the integral non-linearity (INL).

In some example embodiments, the mean integral non-linearity may be generated in the form of a table. The mean integral non-linearity may be generated in the form of a table of mean integral non-linearity according to threshold voltages of the processing elements PE or mean integral non-linearity according to a level of the read voltage VRD. The electronic device 100 may store the table of the mean integral non-linearity (e.g., in a region of memory) and/or may perform the program operation based on the stored table.

Figure 12:
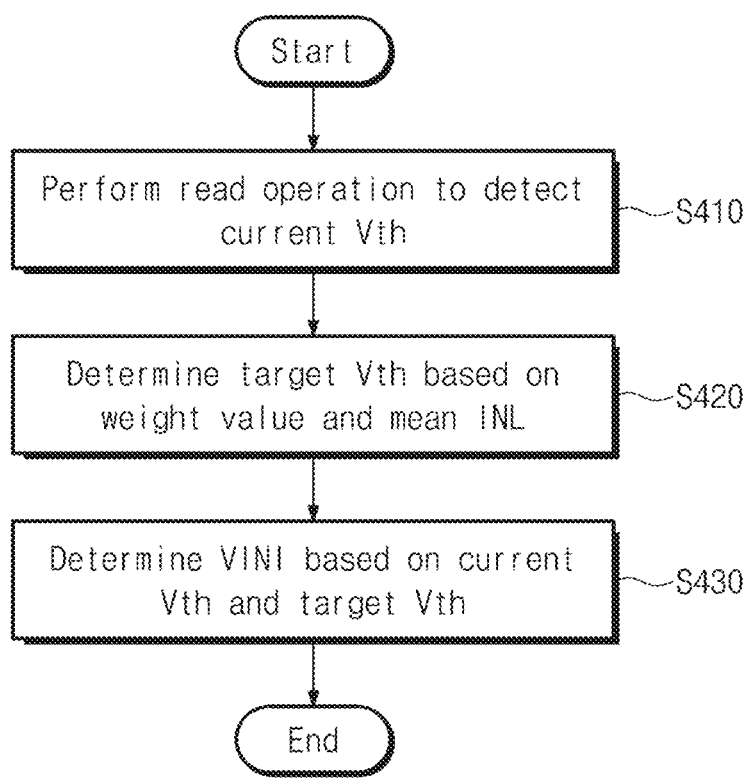
FIG. 12 illustrates an example of performing a program operation based on mean integral non-linearity.

FIG. 12 illustrates an example of performing the program operation based on the mean integral non-linearity. Referring to FIGS. 1, 2, and 12, in operation S410, the electronic device 100 may perform the read operation to detect a current threshold voltage Vth of the processing elements PE. For example, in some embodiments, the read operation may include two or more read operations of detecting a level of the read voltage VRD at which the processing elements PE are turned on and/or a level of the read voltage VRD at which the processing elements PE are turned off.

In operation S420, the electronic device 100 may determine a target threshold voltage Vth based on the weight value WV and the mean integral non-linearity (INL). For example, the target threshold voltage Vth may be determined based on a pre-emphasis for applying the mean integral non-linearity (INL) prior to the read operation (e.g., an inference operation).

In operation S430, the electronic device 100 may determine a program start voltage VINI, based on the current threshold voltage and the target threshold voltage. Afterwards, as described with reference to FIG. 8, the program operation and/or the verification operation may be performed repeatedly and alternately.

Figure 13:
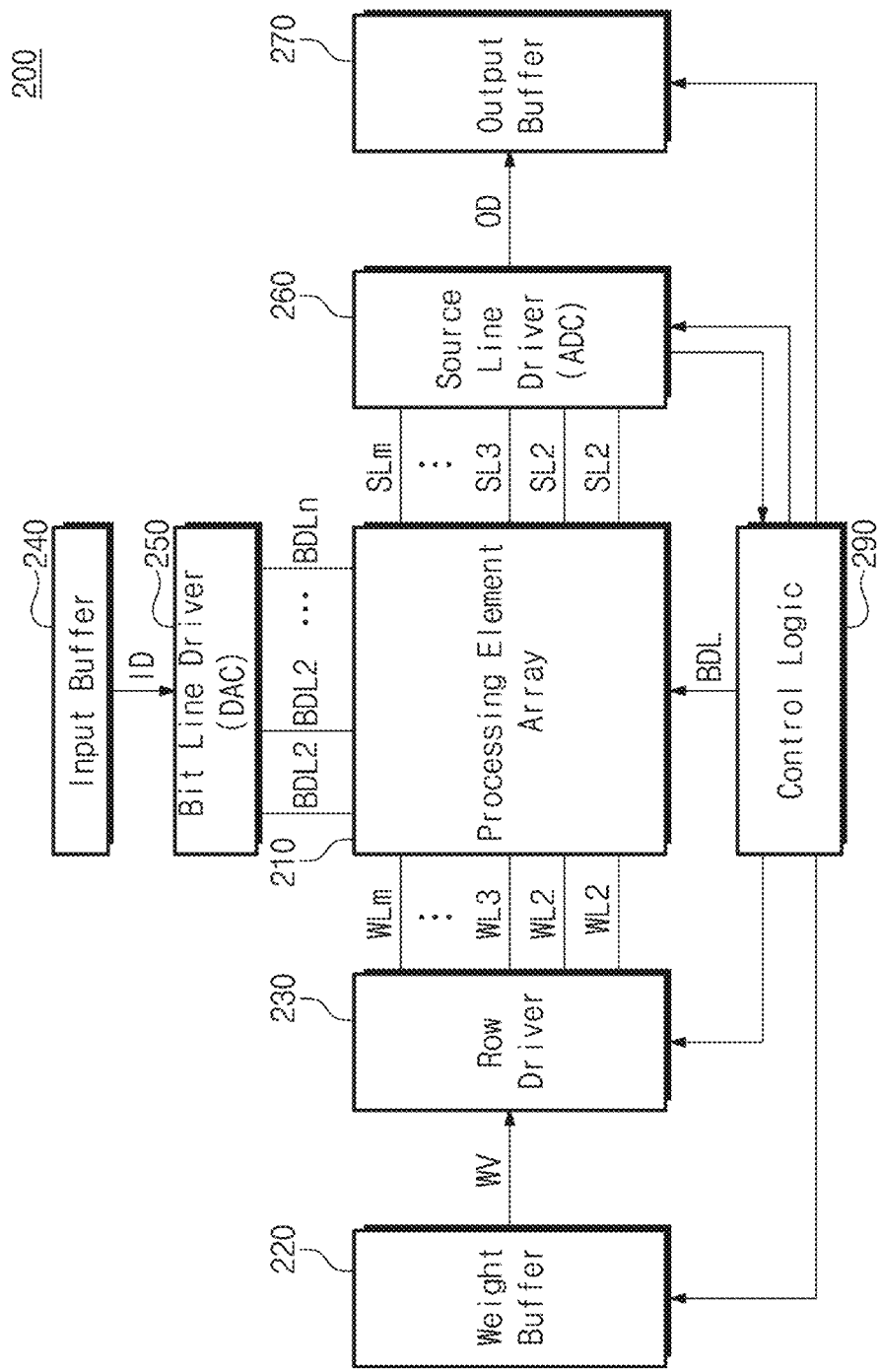
FIG. 13 illustrates an electronic device according to some example embodiments of the present disclosure.

FIG. 13 illustrates an electronic device 200 according to some example embodiments of the present disclosure. For example, the electronic device 200 may include a neural processor and/or a neuromorphic processor. Referring to FIG. 13, the electronic device 200 may include a processing element array 210, a weight buffer 220, a row driver 230, an input buffer 240, a bit line driver 250, a source line driver 260, an output buffer 270, and control logic 290.

The weight buffer 220, the row driver 230, the input buffer 240, the bit line driver 250, the source line driver 260, and the output buffer 270 may be configured to be identical to the weight buffer 120, the row driver 130, the input buffer 140, the bit line driver 150, the source line driver 160, and the output buffer 170 described with reference to FIG. 1. Thus, additional description will be omitted to avoid redundancy.

Figure 14:
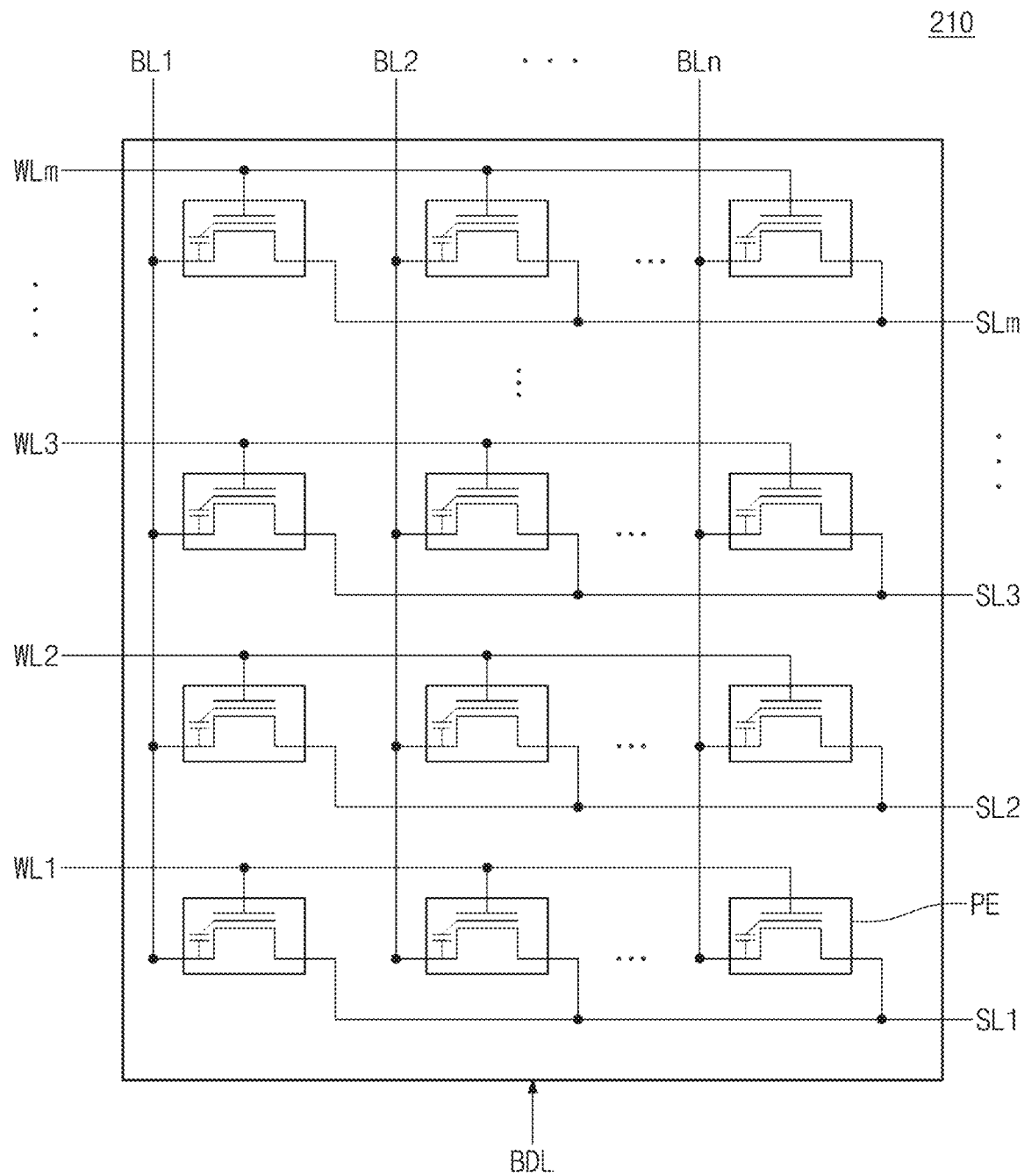
FIG. 14 illustrates a processing element array according to some example embodiments of the present disclosure.

FIG. 14 illustrates the processing element array 210 according to some example embodiments of the present disclosure. Referring to FIGS. 13 and 14, each of the processing elements PE may be based on a flash memory cell that includes a first terminal corresponding to a drain (or a source), a second terminal corresponding to a source (or a drain), a floating gate, and a control gate. Each of the processing elements PE that is based on a flash memory cell may have a structure in which a capacitive element is added between a floating gate and a bit line (and/or a terminal of a bit line side).

In the electronic device 200, the processing element array 210 may not be directly connected with the first to n-th body lines BDL1 to BDLn of FIG. 1. For example, the bodies of the processing elements PE of the processing element array 210 may form a common body and the control logic 290 may supply a voltage to the common body of the processing element array 210 through a body line BDL.

Figure 15:
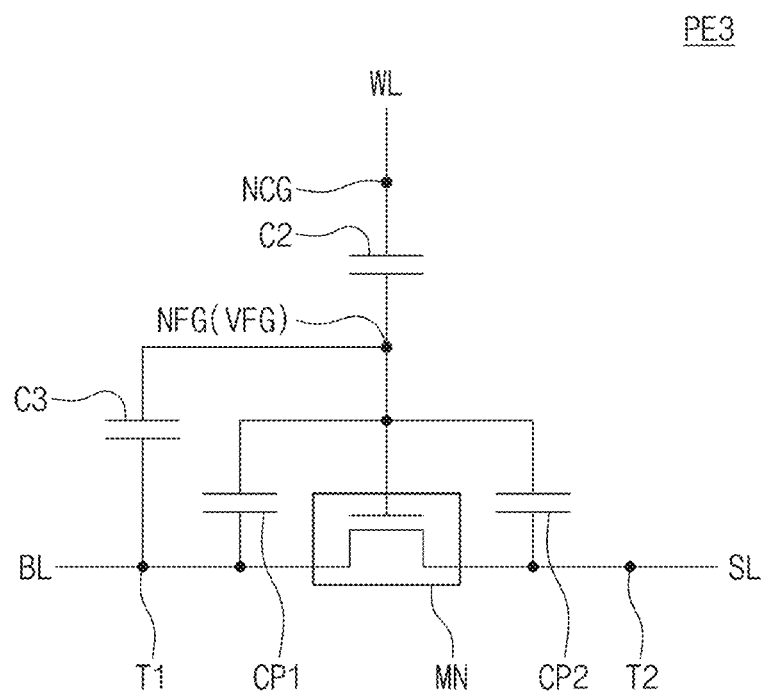
FIG. 15 illustrates a processing element according to a third example.

FIG. 15 illustrates a processing element PE3 according to a third example. The processing element PE3 according to the third example may be a modeled circuit diagram of each of the processing elements PE. Referring to FIGS. 13, 14, and 15, the processing element PE3 may include a transistor MN, a second capacitor C2, a third capacitor C3, a first parasitic capacitor CP1, and a second parasitic capacitor CP2.

The transistor MN, the second capacitor C2, the third capacitor C3, the first parasitic capacitor CP1, and the second parasitic capacitor CP2 may respectively correspond to the transistor MN, the second capacitor C2, the third capacitor C3, the first parasitic capacitor CP1, and the second parasitic capacitor CP2 of FIG. 3. Unlike the description given with reference to FIG. 3, the processing element PE3 may not be individually connected with a (corresponding) body line, and thus, the first capacitor C1 may not be provided.

Figure 16:
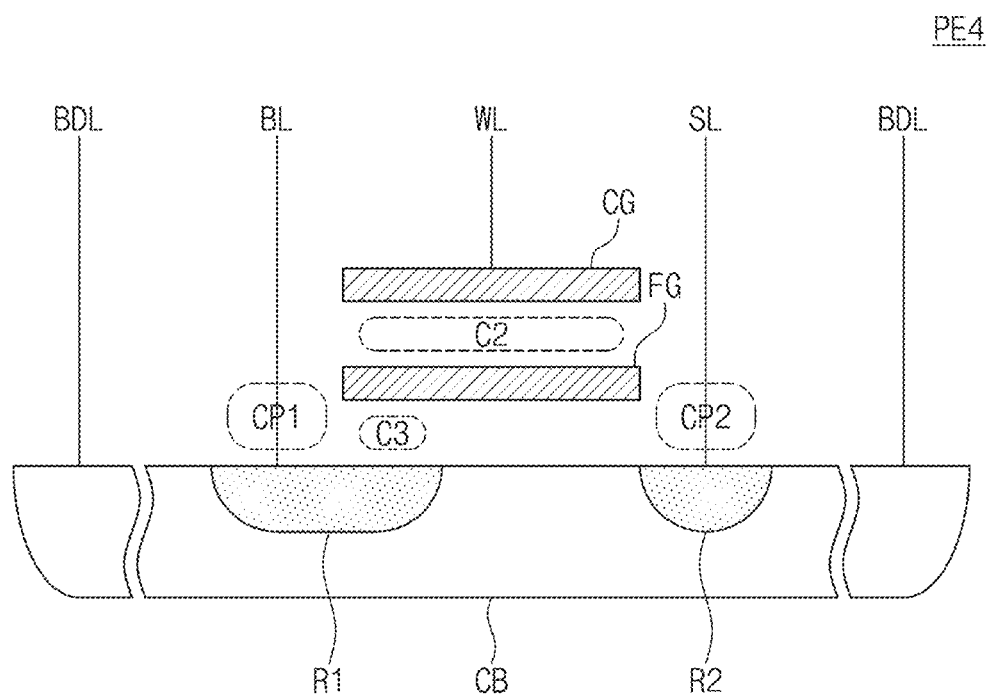
FIG. 16 illustrates a processing element according to a fourth example.

FIG. 16 illustrates a processing element PE4 according to a fourth example. The processing element PE4 according to the fourth example may be a cross-sectional view of each of the processing elements PE. Referring to FIGS. 13, 14, 15, and 16, the processing element PE4 may be implemented at a common body CB. The common body CB may be a substrate, a P-well, and/or a pocket P-well.

A first region R1 may be formed in the common body CB. The first region R1 may be an N-type region, and/or a combination of an N-type region and a P-type region. The first region R1 may correspond to the first terminal T1. The bit line BL may be connected with the first region R1. A second region R2 may be formed in the common body CB. The second region R2 may be an N-type region, and/or a combination of an N-type region and a P-type region. The second region R2 may correspond to the second terminal T2. The source line SL may be connected with the second region R2.

The first region R1 and the second region R2 may be separated from each other within the common body CB. A floating gate FG may be disposed on the common body CB between the first region R1 and the second region R2. The floating gate FG may be electrically separated from the common body CB. The floating gate FG may correspond to the gate of the transistor MN. The floating gate FG, the first region R1, and the second region R2 may constitute the transistor MN.

The floating gate FG and a portion of the first region R1 (e.g., which is not located under the floating gate FG) may form the first parasitic capacitor CP1. The floating gate FG and the second region R2 may form the second parasitic capacitor CP2.

The control gate CG may be disposed on the floating gate FG. The control gate CG may be electrically separated from the floating gate FG. The floating gate FG and the control gate CG may form the second capacitor C2. The floating gate FG and a portion of the first region R1 (e.g., which is extended (and/or located) under the floating gate FG) may form the third capacitor C3.

Figure 17:
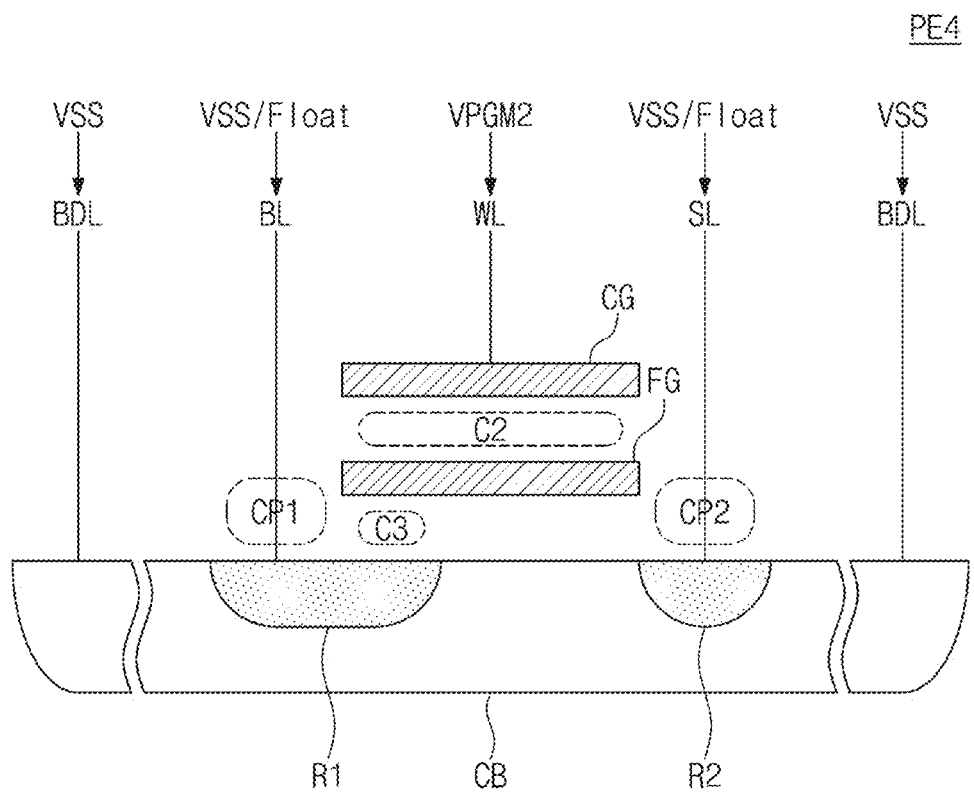
FIG. 17 illustrates an example in which voltages are applied to the processing element of FIG. 16 in a program operation.

FIG. 17 illustrates an example in which voltages are applied to the processing element PE4 in a program operation. Referring to FIGS. 13, 14, 15, and 17, in the program operation, the row driver 230 may apply a program voltage (e.g., a second program voltage VPGM2) to the word line WL. The second program voltage VPGM2 may be a high voltage greater than the power supply voltage. The power supply voltage may be an operating voltage that is supplied from an external device to the electronic device 200.

In the program operation, the bit line driver 250 may apply a ground voltage VSS to the bit line BL and/or may float the bit line BL. The ground voltage VSS may be a voltage that is supplied from the external device to the electronic device 100. In the program operation, the source line driver 260 may apply the ground voltage VSS to the source line SL or may float the source line SL. In the program operation, the control logic 290 may apply the ground voltage VSS to the body line BDL.

An electric field may be generated by a difference between the second program voltage VPGM2 and the ground voltage VSS of the common body CB. The electric field may enable charge tunneling between the common body CB and the floating gate FG. For example, electrons may be injected into the floating gate FG, and thus, a threshold voltage of the processing element PE4 may increase.

Figure 18:
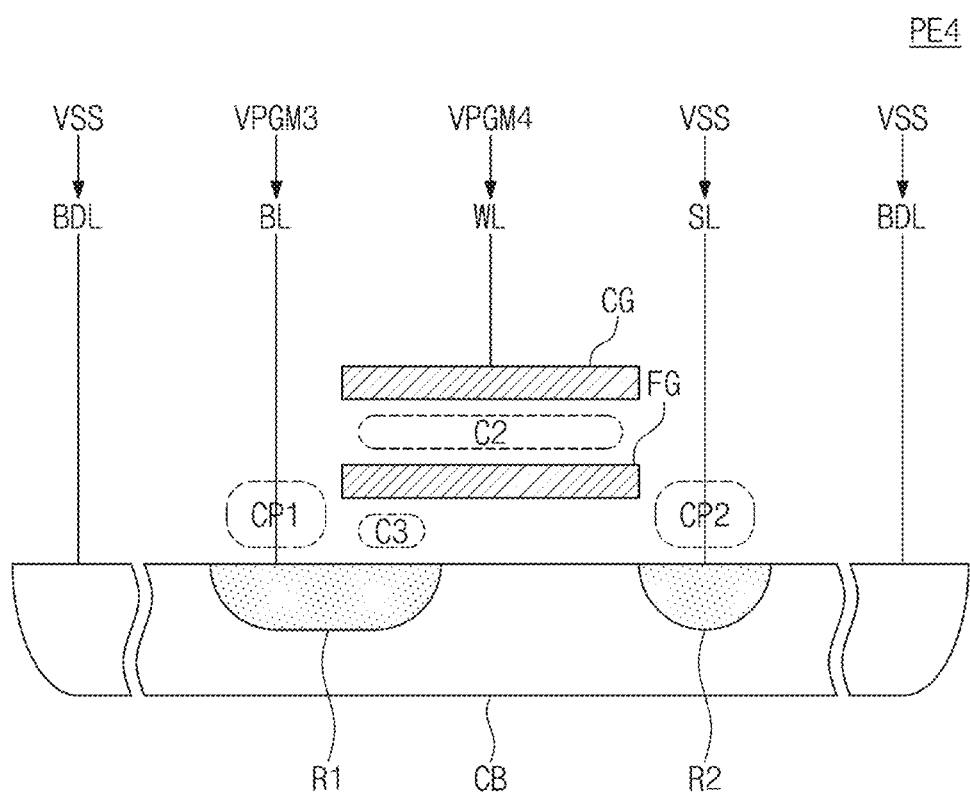
FIG. 18 illustrates an example in which voltages are applied to the processing element of FIG. 16 in a program operation.

FIG. 18 illustrates an example in which voltages are applied to the processing element PE4 in a program operation. Referring to FIGS. 13, 14, 15, and 18, in the program operation, the row driver 230 may apply a program voltage (e.g., a fourth program voltage VPGM4) to the word line WL. The fourth program voltage VPGM4 may be a high voltage greater than the power supply voltage.

In the program operation, the bit line driver 250 may apply a third program voltage VPGM3 to the bit line BL. In the program operation, the source line driver 260 may apply the ground voltage VSS to the source line SL. In the program operation, the control logic 290 may apply the ground voltage VSS to the body line BDL.

Hot charge carriers (e.g., electrons traveling at or above a saturation velocity) may be created by a difference between the third program voltage VPGM3 and the ground voltage VSS of the source line SL. The hot charge carriers (e.g., the electrons) may be injected into the floating gate FG by a difference between the fourth program voltage VPGM4 of the word line WL and the ground voltage VSS of the common body CB. Thereby, a threshold voltage of the processing element PE4 may increase.

Figure 19:
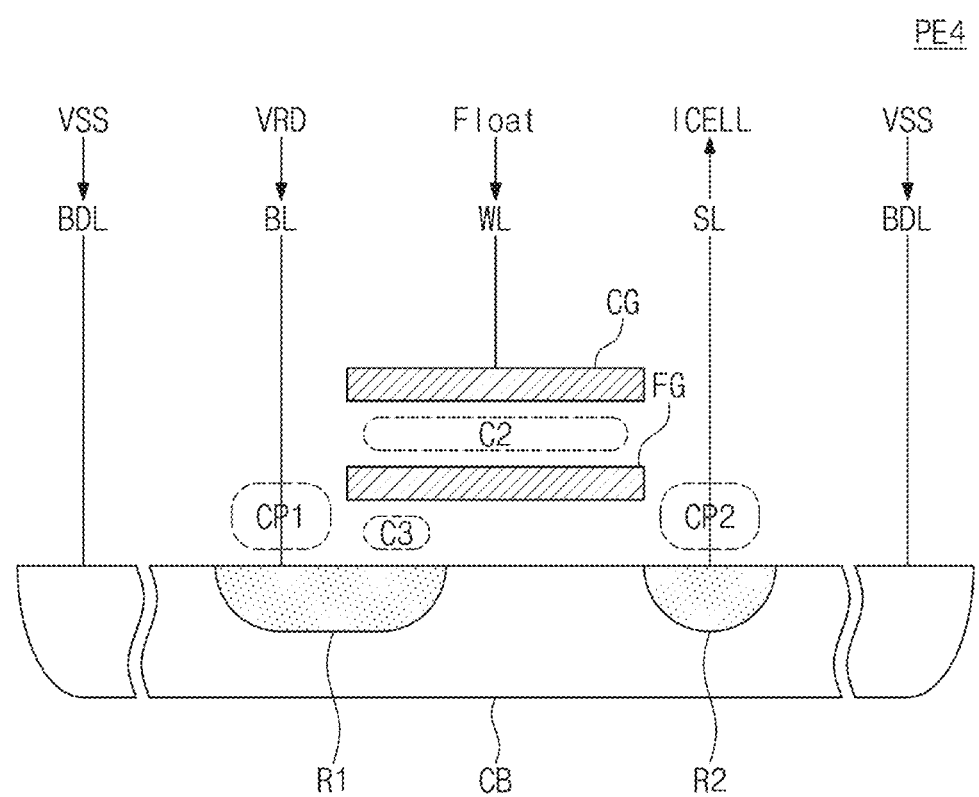
FIG. 19 illustrates an example in which voltages are applied to the processing element of FIG. 16 in a read operation.

FIG. 19 illustrates an example in which voltages are applied to the processing element PE4 in the read operation. Referring to FIGS. 13, 14, 15, and 19, in the read operation, the row driver 230 may float the word line WL. In the read operation, the bit line driver 250 may apply the read voltage VRD to the bit line BL. In the read operation, the control logic 290 may apply the ground voltage VSS to the body line BDL.

The read voltage VRD may be transferred to the floating gate FG by the coupling of the third capacitor C3. The read voltage VRD transferred to the floating gate FG may form a channel in a region of the common body CB between the first region R1 and the second region R2.

For example, the transistor MN may be turned on by the read voltage VRD, and a current (for example the cell current ICELL) may flow from the bit line BL to the source line SL. In the read operation, the source line driver 260 may receive the cell current ICELL from the source line SL.

As discussed above, Equation 1 shows the cell current ICELL modeled when there is no third capacitor C3. As expressed by Equation 1, the cell current ICELL includes a non-linear component. Accordingly, a range of the read voltage VRD of the processing element PE4 (e.g., an operation range of the processing element PE4) may be limited.

Equation 4 below shows the cell current ICELL modeled when the third capacitor C3 is added. In some example embodiments, Equation 4 may be multiplied by any constant number.

$$ICELL = (VFG - VTH) \cdot VBL - \left(\frac{1}{2} - \frac{CP2}{C2 + CP1 + CP2}\right) \quad \text{[Equation 4]}$$

In response to a condition of Equation 5 being satisfied, a non-linear component may be removed from the cell current ICELL.

$$\frac{CP2}{C2 + CP1 + CP2} = \frac{1}{2} \quad \text{[Equation 5]}$$

In response to the non-linear component being removed from the cell current ICELL, the amount of cell current ICELL may be in the form of a linear product of a bit line voltage. For example, the processing element PE4 may operate as a linear multiplier. Because the linearity of the processing element PE4 is improved, an operation range of a value of input data of the processing element PE4 may be expanded.

In some example embodiments, the read operation may be identical to that described with reference to FIG. 7. As described with reference to FIG. 8, the read operation may be changed and used to the verification operation. The program operation and the verification operation may be performed repeatedly and alternately. A level of the program voltage VPGM2, VPGM3, and/or VPGM4 may gradually increase. As described with reference to FIG. 9, the program voltage VPGM2, VPGM3, and/or VPGM4 and/or the verification voltage VFY may be determined based on the weight value WV.

In some embodiments, as described with reference to FIGS. 11 and 12, the electronic device 100 may perform a pre-emphasis program operation based on the mean integral non-linearity.

Figure 20:
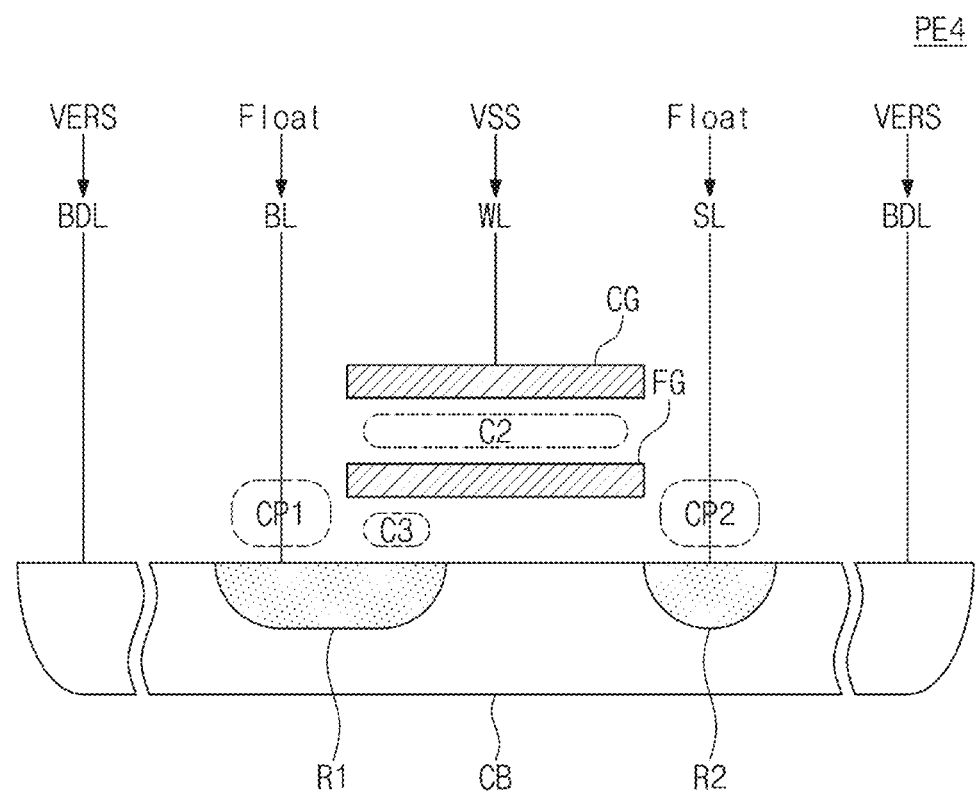
FIG. 20 illustrates an example in which voltages are applied to the processing element of FIG. 16 in an erase operation.

FIG. 20 illustrates an example in which voltages are applied to the processing element PE4 in an erase operation. Referring to FIGS. 13, 14, 15, and 20, in the erase operation, the row driver 230 may apply the ground voltage VSS to the word line WL.

In the erase operation, the bit line driver 250 may float the bit line BL. In the erase operation, the source line driver 260 may float the source line SL. In the erase operation, the control logic 290 may apply the erase voltage VERS to the body line BDL. The erase voltage VERS may be a high voltage greater than the power supply voltage.

The ground voltage VSS applied to the word line WL and the erase voltage VERS applied to the body line BDL may form an electric field. Accordingly, electrons may be discharged from the floating gate FG to the common body CB. Thereby, a threshold voltage of the processing element PE4 may decrease.

In some embodiments, as described with reference to FIG. 8, the erase operation and the verification operation may be performed repeatedly and alternately. As the erase operation is repeated, the erase voltage VERS may gradually increase.

Figure 21:
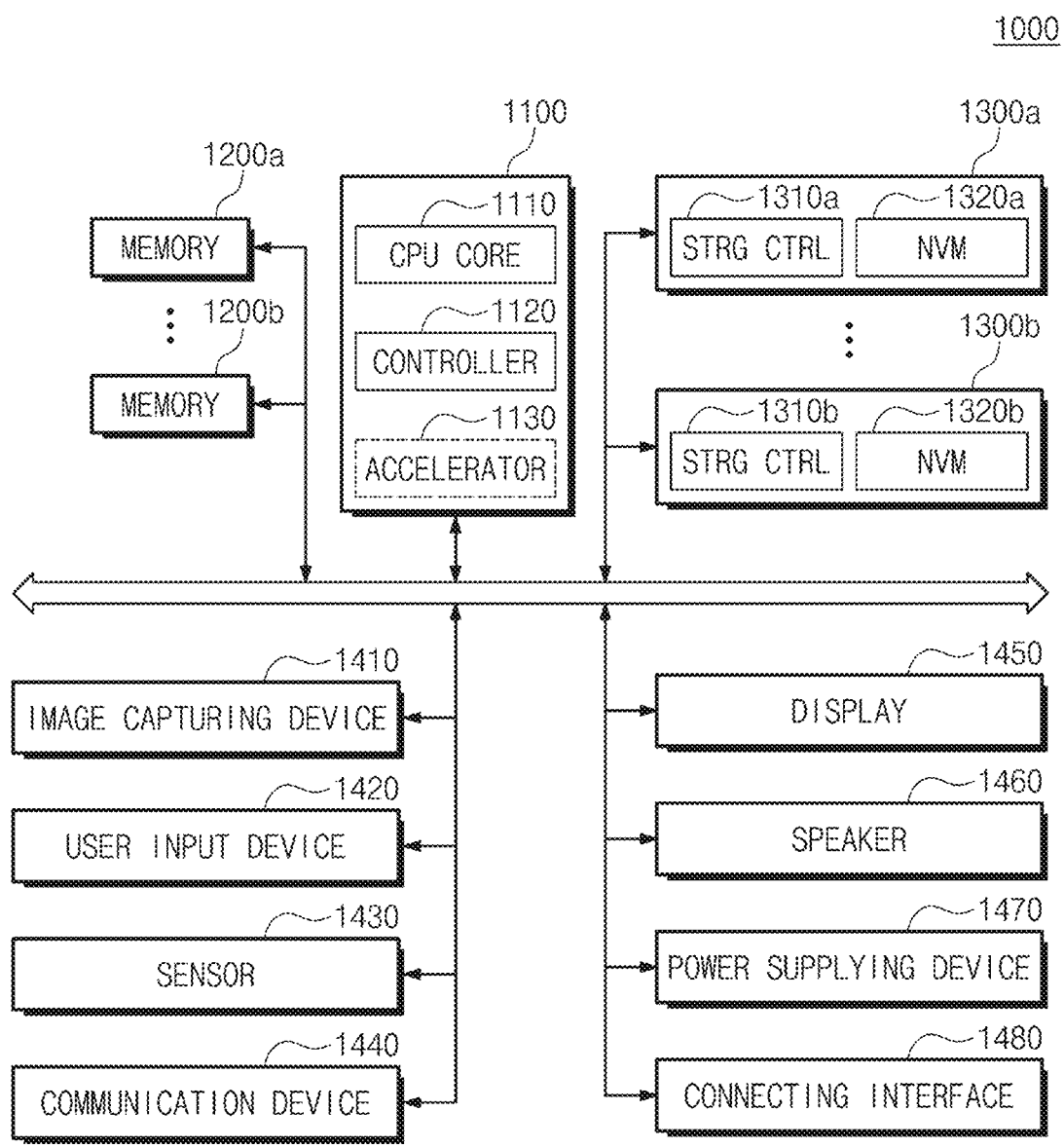
FIG. 21 is a diagram illustrating a system to which an electronic device according to some example embodiments of the present disclosure is applied.

FIG. 21 is a diagram of a system 1000 to which an electronic device is applied, according to some example embodiments. The system 1000 of FIG. 21 may be a mobile system, such as a portable communication terminal (e.g., a mobile phone), a smartphone, a tablet personal computer (PC), a wearable device, a healthcare device, and/or an Internet of things (JOT) device. However, the system 1000 of FIG. 21 is not necessarily limited to the mobile system and may be a PC, a laptop computer, a server, a media player, and/or an automotive device (e.g., a navigation device).

Referring to FIG. 21, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and may be implemented as a chip that is physically separate from the other components of the main processor 1100. For example the accelerator may be implemented with the electronic device 100 or 200 described with reference to FIGS. 1 to 20.

The memories 1200a and 1200b may be used as main memory devices of the system 1000. Each of the memories 1200a and 1200b may include a volatile memory, such as static random access memory (SRAM) and/or dynamic RAM (DRAM), and/or a non-volatile memory, such as a flash memory, phase-change RAM (PRAM) and/or resistive RAM (RRAM). The memories 1200a and 1200b may be implemented in the same package as the main processor 1100.

The main processor 1100, in some embodiments, may include some and/or all of the electronic device 100 and/or 200. For example, in some embodiments, the main processor 1100 may include the control logic 190 and/or 290. In some embodiments, the CPU cores 1110 may include at least the processing element array 110. In some other embodiments, at least one of the memory 1200a and/or 1200b may include the processing element array 110, the weight buffer 120, the input buffer 140, and/or the output buffer 170.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memory(s) (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and/or included in the system 1000 and/or implemented in the same package as the main processor 1100. In addition, the storage devices 1300a and 1300b may have types of solid-state devices (SSDs) and/or memory cards and be severable (e.g., removable) and/or combined with other components of the system 1000 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a camera, an acoustics sensors, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device (not shown), which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer system interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and/or a compact flash (CF) card interface.

In the above embodiments, components according to the present disclosure are described by using the terms "first", "second", "third", etc. However, the terms "first," "second," "third," etc. are used to distinguish components from each other and do not otherwise limit the present disclosure. For example, the terms "first," "second," "third," etc. do not necessarily involve an order or a numerical meaning of any form.

In the above embodiments, components according to embodiments of the present disclosure are referenced by using blocks. The blocks may be implemented with various processing circuitry such as hardware including logic circuits; a hardware/software combination such as a processor executing software; and/or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), complex programmable logic devices (CPLD), firmware driven in hardware devices, integrated circuits (IC), an application specific IC (ASIC), etc. Also, the blocks may include circuits implemented with semiconductor elements in an integrated circuit, or circuits enrolled as an intellectual property (IP).

According to the present disclosure, processing elements in which a capacitive element is added between a floating gate of a flash memory cell and a bit line of the flash memory cell is provided. Accordingly, a processing element having an improved operation range and an electronic device including the processing element are provided.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. An electronic device comprising:
a plurality of processing elements in rows and columns;
a plurality of word lines connected with the rows of the plurality of processing elements;
a plurality of bit lines connected with the columns of the plurality of processing elements;
a plurality of body lines connected with the columns of the plurality of processing elements;
a plurality of source lines connected with the rows of the plurality of processing elements; and
a body line driver connected with the plurality of body lines, and configured to float a body line selected from the plurality of body lines in a read operation,
wherein each of the plurality of processing elements includes
a body including a first terminal connected with a corresponding bit line of the plurality of bit lines, a second terminal connected with a corresponding source line of the plurality of source lines, and a body terminal connected with a corresponding body line of the plurality of body lines,
a control gate between the first terminal and the second terminal, and connected with a corresponding word line of the plurality of word lines,
at least one charge storage element between the control gate and the body, and
a conductive material on the at least one charge storage element, the conductive material being connected to the corresponding bit line and separated from the control gate, and forming a capacitive element between the at least one charge storage element and the corresponding bit line.

2. The electronic device of claim 1, wherein the at least one charge storage element includes:
a first portion on the body between the first terminal and the second terminal;
a second portion on the body terminal;
a third portion configured to form a capacitive coupling with the control gate; and
a fourth portion configured to form a capacitive coupling with a conductive material connected with the corresponding bit line.

3. The electronic device of claim 2, wherein
the plurality of processing elements share a common body, and
the body terminal extends in a column direction such that the body terminal is shared by each of the rows.

4. The electronic device of claim 1, further comprising:
a row driver connected with the plurality of word lines, and configured to float a word line selected from the plurality of word lines in the read operation; and
a bit line driver connected with the plurality of bit lines, and configured to apply a read voltage to a bit line selected from the plurality of bit lines in the read operation.

5. The electronic device of claim 1, further comprising:
a row driver connected with the plurality of word lines, and configured to apply a ground voltage to a word line selected from the plurality of word lines in an erase operation; and
a control logic connected with the plurality of body lines, and configured to apply an erase voltage to a body line selected from the plurality of body lines in the erase operation.

6. An electronic device comprising:
a plurality of processing elements in rows and columns;
a plurality of word lines connected with the rows of the plurality of processing elements;
a plurality of bit lines connected with the columns of the plurality of processing elements; and
a plurality of source lines connected with the rows of the plurality of processing elements,
wherein each of the plurality of processing elements includes
a body including a first terminal connected with a corresponding bit line of the plurality of bit lines and a second terminal connected with a corresponding source line of the plurality of source lines,
a control gate between the first terminal and the second terminal, and connected with a corresponding word line of the plurality of word lines,
a charge storage element between the control gate and the body, and
a capacitive element between the charge storage element and the corresponding bit line, and
wherein the body has a first region of a first conductive type, and a second region of a second conductive type including the first terminal, and a third region of the second conductive type including the second terminal,
the capacitive element includes a capacitive coupling between the charge storage element and the region of the second conductive type under the charge storage element, and
a first size of the second region under the control gate is greater than a second size of the third region under the control gate.

7. The electronic device of claim 6, further comprising:
a row driver connected with the plurality of word lines, and configured to apply a program voltage to a word line selected from the plurality of word lines in a program operation; and
a bit line driver connected with the plurality of bit lines, and configured to apply a ground voltage to a bit line selected from the plurality of bit lines in the program operation.

8. The electronic device of claim 7, wherein, in a verification operation,
the row driver is configured to float the selected word line, and
the bit line driver is configured to apply a verification voltage to the selected bit line.

9. The electronic device of claim 8, wherein
the electronic device is configured to perform the program operation and the verification operation repeatedly and alternately, and
the program voltage gradually increases during the repeating.

10. The electronic device of claim 8, further comprising:
a weight buffer configured to store a weight value,
wherein the row driver is configured to generate the verification voltage based on the weight value.

11. The electronic device of claim 6, further comprising:
a row driver connected with the plurality of word lines, and configured to apply a first program voltage to a word line selected from the plurality of word lines in a program operation; and a bit line driver connected with the plurality of bit lines, and configured to apply a second program voltage to a bit line selected from the plurality of bit lines in the program operation.

12. The electronic device of claim 6, further comprising:
a row driver connected with the plurality of word lines, and configured to float a word line selected from the plurality of word lines in a read operation; and
a bit line driver connected with the plurality of bit lines, and configured to apply a read voltage to a bit line selected from the plurality of bit lines in the read operation.

13. The electronic device of claim 12, further comprising:
an input buffer configured to store input data,
wherein the bit line driver is configured to, using a digital-to-analog conversion, convert the input data into the read voltage.

14. The electronic device of claim 12, further comprising:
an analog-to-digital converter connected with the source lines, and configured to convert an amount of current output through a source line, from among the plurality of source lines and corresponding to the selected word line, into a digital value.

15. The electronic device of claim 14, wherein the electronic device is configured to output a sum of currents, output from two or more processing elements connected with the selected word line, through the source line.

16. The electronic device of claim 6, further comprising:
a row driver connected with the plurality of word lines, and configured to apply a ground voltage to the plurality of word lines in an erase operation; and
control logic,
wherein the plurality of processing elements share a common body, and
the control logic is configured to apply an erase voltage to the common body of the plurality of processing elements in the erase operation.

17. A processing element comprising:
a body including a first terminal connected with a bit line, a second terminal connected with a source line, and a body terminal connected with a conductive line;
a control gate connected with a word line;
at least one charge storage element between the control gate and the body; and
a conductive material on the at least one charge storage element, the conductive material being connected to the bit line and separated from the control gate, and forming a capacitive element between the charge storage element and the bit line,
wherein the at least one charge storage element includes
a first portion on the body between the first terminal and the second terminal,
a second portion on the body terminal, the second portion being separated from the first portion,
a third portion configured to form a capacitive coupling with the control gate, the third portion being separated from the first portion and the second portion, and
a fourth portion configured to form a capacitive coupling with the conductive material connected with the bit line, the fourth portion being separated from the first portion, second portion and the third portion.

18. The processing element of claim 17, wherein
the body has a first conductive type and a region of a second conductive type,
the region of the second conductive type includes the first terminal, and
the capacitive element includes a capacitive coupling between the charge storage element and the region of the second conductive type.

* * * * *